(12) United States Patent
Lee

(10) Patent No.: US 6,516,136 B1
(45) Date of Patent: Feb. 4, 2003

(54) ITERATIVE DECODING OF CONCATENATED CODES FOR RECORDING SYSTEMS

(75) Inventor: Inkyu Lee, Kearny, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/347,983

(22) Filed: Jul. 6, 1999

(51) Int. Cl.⁷ ................................................. H04N 5/76
(52) U.S. Cl. ........................ 386/124; 386/46; 360/48; 369/124.01
(58) Field of Search ................................. 386/1, 33, 40, 386/45, 46, 116, 124, 125–126; 360/32, 48, 53–54; 369/47.2, 59.1, 124.01, 124.09; 714/770, 771, 769, 776, 780, 786, 759, 755; 375/262, 265, 341; H04N 5/76, 5/781, 5/783, 9/79

(56) References Cited

U.S. PATENT DOCUMENTS

| | | | | |
|---|---|---|---|---|
| 5,721,745 A | * | 2/1998 | Hladik et al. | 714/755 |
| 5,933,462 A | * | 8/1999 | Viterbi et al. | 375/341 |
| 6,182,261 B1 | * | 1/2001 | Haller et al. | 714/758 |
| 6,233,711 B1 | * | 5/2001 | Murayama et al. | 714/786 |
| 6,397,367 B1 | * | 5/2002 | Park et al. | 714/786 |
| 6,421,804 B1 | * | 7/2002 | Lee | 714/755 |

* cited by examiner

Primary Examiner—Thai Tran
(74) Attorney, Agent, or Firm—Steve Mendelsohn; Ian M. Hughes

(57) ABSTRACT

A data recording system employs parallel iterative decoding of soft output samples representing encoded data read from a storage medium. The iterative decoder reads packets of data from a sector of the medium, each packet containing soft output samples representing data encoded with a concatenated code formed from N component codes, N a positive integer. The iterative decoder employs I decoding iterations, I a positive integer. Each packet has a length substantially equal to the sector length divided by N. For an exemplary magnetic recording system, encoded data read from a sector of a magnetic medium is partitioned into N packets of length 4096/N. The first packet is passed to the first component code decoder of a parallel iterative decoder. When the second packet is ready to be passed to the first component code decoder, the decoded output values of the first packet in the first decoder are passed to the second component code decoder. The second packet is then applied to the first component code decoder. This operation is repeated until the last (Nth) packet is input to the first component code decoder. When the last (Nth) packet is input to the first component code decoder, all data in a sector is stored within the parallel iterative decoder and servo mode of the magnetic recording system is enabled. During servo mode, the iterative process of the iterative decoder begins. The decoded output of the first packet in the last (Nth) component code decoder is now input to the first component code decoder and the second iteration starts. Each packet in the corresponding component code decoder is then circularly shifted to the next component code decoder. After repeating the decode and shift operation for I iterations, each successive packet output from the last (Nth) component code decoder is provided as the decoded user data.

16 Claims, 4 Drawing Sheets

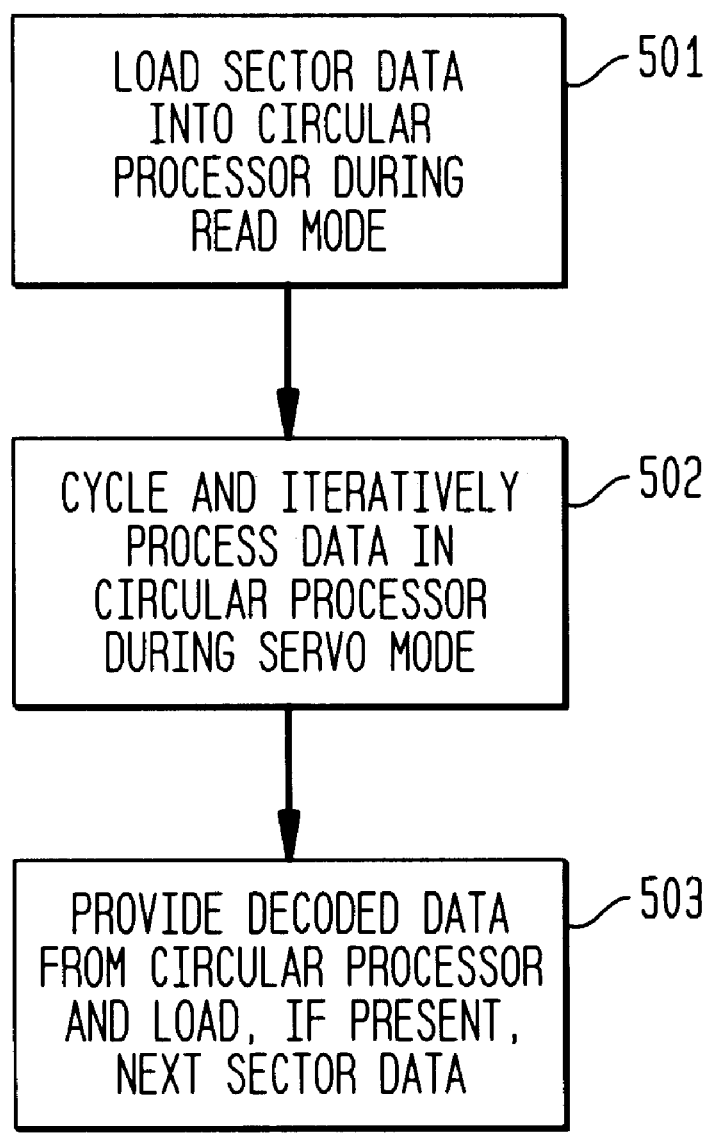

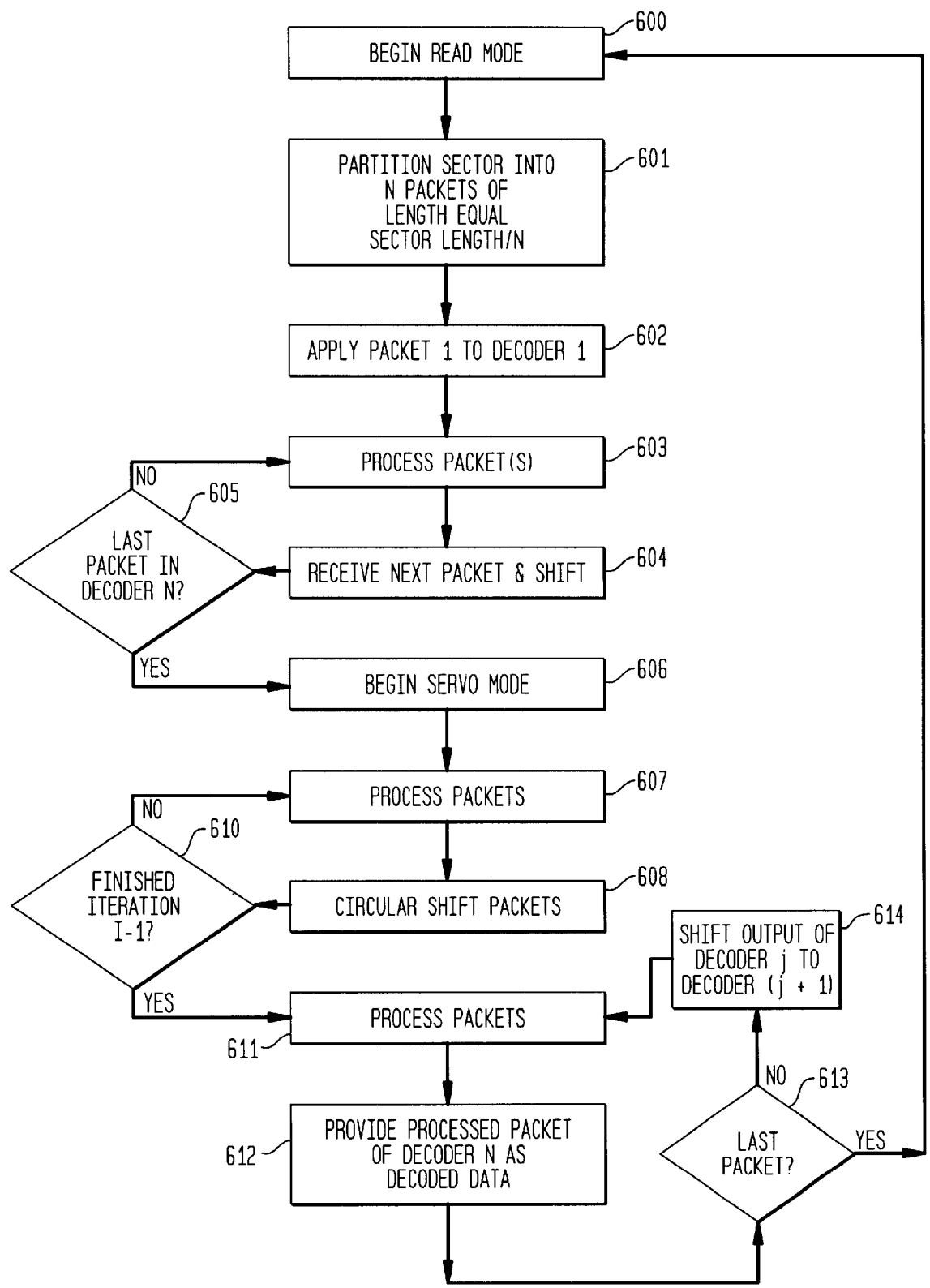

ITERATIVE DECODING OF CONCATENATED CODES FOR RECORDING SYSTEMS

BACKGROUND OF THE INVENTION

1. Field of the Invention

The present invention relates to decoding of data stored on a recording medium that is encoded with concatenated codes.

2. Description of the Related Art

Magnetic recording systems first encode user data into binary coded data bits that are subsequently recorded on a magnetic medium. Writing data to, and reading data from, the magnetic medium may be modeled as a transmission channel having an associated frequency response. A signal may then be read from the magnetic medium and sampled to provide a sequence of output samples containing the stored data. Magnetic recording systems for disk drives read and detect data from sectors of tracks on the magnetic medium (disk). Each track comprises user ("read") data sectors as well as system dedicated control (e.g., "servo") data sectors embedded between read sectors. Read data sectors store encoded user data that is read during read mode. Servo data sectors store servo data that is read during servo mode. Servo data is control data that the recording system uses during servo mode to 1) search for tracks (during sub- mode) and 2) position a read head over the track on the magnetic medium.

FIG. 1 shows a block diagram of a magnetic recording system 100. A portion of the data stream is encoded with a predetermined code by data encoder 101. The remaining, non-encoded portion of the data and the encoded portion of the data are further processed by the magnetic write head 102 and then recorded on the magnetic medium 110 by the magnetic write head 102. Magnetic recording systems such as system 100 may employ one or more types of codes for data encoder 101 to map data bits to binary coded data bits. Such codes may be run-length limited (RLL) block codes, general convolutional codes, or 2T/bi-phase codes.

A magnetic read head 103 reads the information from the magnetic recording medium 110 as an analog signal. Magnetic write head 102 and magnetic read head 103 may be implemented as a single head read/write device. Magnetic read head 103 may provide a sampled analog signal representing the recorded user data and servo data as output channel samples. The term "output channel sample" refers to data that has passed through a transmission channel (e.g., magnetic medium 110 and magnetic read head 103) that has a form of frequency response (possibly having memory). This type of transmission channel (possibly including the frequency response of a subsequent equalizer) may be termed a partial response channel. The signal containing the encoded data has an added noise component and added signal distortion caused by passing the signal through the channel's frequency response. To partially correct for variations in the channel's frequency response or for frequency response characteristics of the circuitry of magnetic read head 103, the output channel samples may be applied to equalizer 104. The equalized output channel samples are then applied to a soft output detector 105, such as a partial-response, maximum-likelihood (PRML) detector. As shown in FIG. 1, soft output detector 105 is a PRML detector.

The exemplary PRML detector 105 employs an algorithm, such as the Viterbi algorithm (VA), to detect the sequence of symbol bits representing the encoded data from the equalized channel samples. An additional algorithm may be employed by a processor after the equalizer 104 to convert the equalized channel samples to a sequence soft output samples. Data decoder 106 receives the sequence of soft output samples from the soft output detector 105 and decodes the sequence to reconstruct the data.

For an exemplary magnetic recording system 100, one sector of data recorded on the medium comprises 512 bytes (4096 bits). After data in one section is processed, the operation of the servo mode changes the position of the magnetic read head 103. During the servo mode operation, the read mode operation is suspended until the servo mode operation is complete. Each of the servo and read mode operations requires a corresponding decoding operation.

Concatenated code systems for encoding and decoding data use two or more component codes that are concatenated during the process of encoding data. Although the codes may be of any type, component codes are typically relatively simple codes, such as the rate 8/9 convolutional code. The two or more component codes are concatenated in either a serial concatenation or a parallel concatenation. In both methods of concatenation, an interleaver may be inserted between the encoders for the component codes. For example, in the serial concatenation of two component codes, data is encoded by a first encoding module with a first component code. This encoded data is, in turn, passed through an interleaver and then applied to a second encoding module for encoding with a second component code. This process operates on only a single, serial data stream, and the first and second component codes may be the same code. In the parallel concatenation, data is encoded with the first component code and also the interleaved data is encoded with a second component code. The two encoded streams are combined in parallel to provide a single encoded data stream, for example, by multiplexing.

Concatenated code systems may employ iterative decoding of encoded data using either serial or parallel iterative decoding methods. Each of the serial or parallel iterative decoding methods may be employed for serial concatenated codes. Each of the serial or parallel iterative decoding methods may be employed for parallel concatenated codes. When employing iterative decoding of data encoded with a concatenated code, a block of data is input to the iterative decoder. The block boundaries desirably conform to symbol boundaries of the concatenated code. The iterative decoder comprises at least one decoding module having N component code decoders for decoding N component codes. Each decoding module and/or component code decoder may typically include a maximum a posteriori, (MAP) decoder. The particular implementation of the decoding module is dependent on which method of serial or parallel concatenation is used by the concatenated code.

In an iterative decoding method, a block of the soft output samples representing encoded data is repetitively processed for decoding by the two or more decoding modules until a predetermined number (I) of decoding iterations are complete. An exemplary iterative decoder 200 employing serial iterative decoding is shown in FIG. 2. Each decoding module 201–203 performs a complete, "soft" decoding of the data encoded with a concatenated code. Each decoding module applies an iteration of the decoding process, and each iteration allows for higher confidence in the decisions for bits in the output decoded data that are made based on the output samples of a detector, such as the PRML detector 105. Each decoding module includes N component code decoders 210–212 (i.e., Decoder 1 through Decoder N).

Each component code decoder corresponds to one of the N component codes employed by the concatenated code. Each of the component code decoders 210–212 may include, for example, a MAP decoder and a deinterleaver.

For the implementation of serial iterative decoding shown in FIG. 2, I iterations of the decoding operations are performed on each packet. A new block is applied to the first decoding module 201 as the previous packet is applied to the second decoding operation of decoding module 202. The second decoding operation of decoding module 202 corresponds to the second decoding iteration. A fully decoded block is provided as data from the Ith decoding module 203, corresponding to the Ith decoding iteration. Once all decoding modules 201–203 of iterative decoder 200 are loaded with data, the decoding process may occur in a pipeline fashion and/or continuously as each new block is applied.

To avoid a repeated implementation of the two or more decoding modules in the serial iterative decoding such as shown in FIG. 2, an implementation using a parallel iterative decoding operation, such as shown in FIG. 3, may be alternatively employed. The parallel iterative decoder 300 shown in FIG. 3 may employ a decoding module similar to that of a single decoding module of the serial implementation (e.g., decoding module 201 of FIG. 2). However, the parallel iterative decoder 300 employs feedback of data from the last component code decoder (Decoder N) to the first component code decoder (Decoder 1). After loading N blocks into the N component code decoders 301–303 (Decoder 1 through Decoder N), the output decoded block of the last component code decoder 303 is then provided as the input block to the first component code decoder 301. With feedback, the block may be decoded by cyclic shifting through the component code decoders of the decoding module for I iterations. Once again, each iteration of decoding may provide a "guess" to the decoded block of bits. For the parallel iterative decoding module, the delay in processing a series of blocks increases since the next block for decoding must be buffered as the present block is decoded. For both serial and parallel implementations of the iterative decoder of FIGS. 2 and 3, N component codes may be decoded with the N component code decoders.

Use of concatenated codes for magnetic recording systems introduces a latency period from added processing time incurred by the additional decoding operations. In magnetic recording systems, a parallel iterative decoding module of FIG. 3 may not be desirable for use with, for example, the data decoder 106 of FIG. 1, if the long latency period between each read operation by the magnetic read head reduces magnetic recording system performance to unacceptable levels. For example, one input block of length L experiences a delay of LNI clock cycles of an iterative decoder. Consequently, until the iterative decoder completes a decoding process for one block, the next block must be buffered. Therefore, iterative decoding is performed serially in a pipelined fashion.

The implementation complexity (i.e., circuit size and number of components) of the serial iterative decoding module, because of repeated operations of each iteration, increases the requirement for power and integrated circuit area. For example, the complexity of the circuit implementing the serial iterative decoder of FIG. 2 is I times higher than the complexity of the circuit implementing the parallel iterative decoder of FIG. 3.

SUMMARY OF THE INVENTION

The present invention relates iterative decoding of data stored in a medium of a recording system in which the data is user data that is encoded with concatenated codes. In accordance with an exemplary embodiment, a section of the data is read from the medium as a number of packets during a read mode of the recording system. The data is encoded in accordance with a concatenated code having N component codes, N an integer greater than 1, and the number of packets is related to N. The packets of the section of data are loaded into a circular processor during read mode, the circular processor decoding in accordance with the N component codes. A circular processor iteratively cycles and processes the packets during a servo mode of the recording system. The decoded section of the data from the circular processor is then provided and, if present, the next section of the data is loaded into the circular processor in read mode and the iterative decoding process is repeated. In accordance with a further embodiment of the present invention, the circular processor is a parallel iterative decoder.

BRIEF DESCRIPTION OF THE DRAWINGS

Other aspects, features, and advantages of the present invention will become more fully apparent from the following detailed description, the appended claims, and the accompanying drawings in which:

FIG. 5 is a flow chart of reading and iterative decoding of data in accordance with an exemplary embodiment of the present invention; and FIG. 6 is a flow chart showing the steps of an exemplary implementation of iterative decoding of FIG. 5 for a recording system.

DETAILED DESCRIPTION

In accordance with the present invention, a data recording system employs an iterative decoder with parallel iterative decoding of encoded data read from a storage medium. The iterative decoder reads packets of data from a sector of the medium, each packet containing data encoded with a concatenated code formed from N component codes, N a positive integer. The iterative decoder employs I decoding iterations, I a positive integer. Each packet has a length substantially equal to the sector length divided by N. Such partitioning of the data in the sector into packets allows a parallel iterative decoding method to process packets of a sector continuously between operations to read encoded data. Such processing may allow the advantage of continuous iterative decoding with reduced circuit complexity of the iterative decoder. While the preferred embodiments are described herein as implementations for use with magnetic recording systems, the present invention is not so limited. Embodiments of the present invention may be employed in other processing systems, such as optical recording or telemetry systems, in which iterative decoding may be employed between data acquisition and system control operations.

Figure 4:
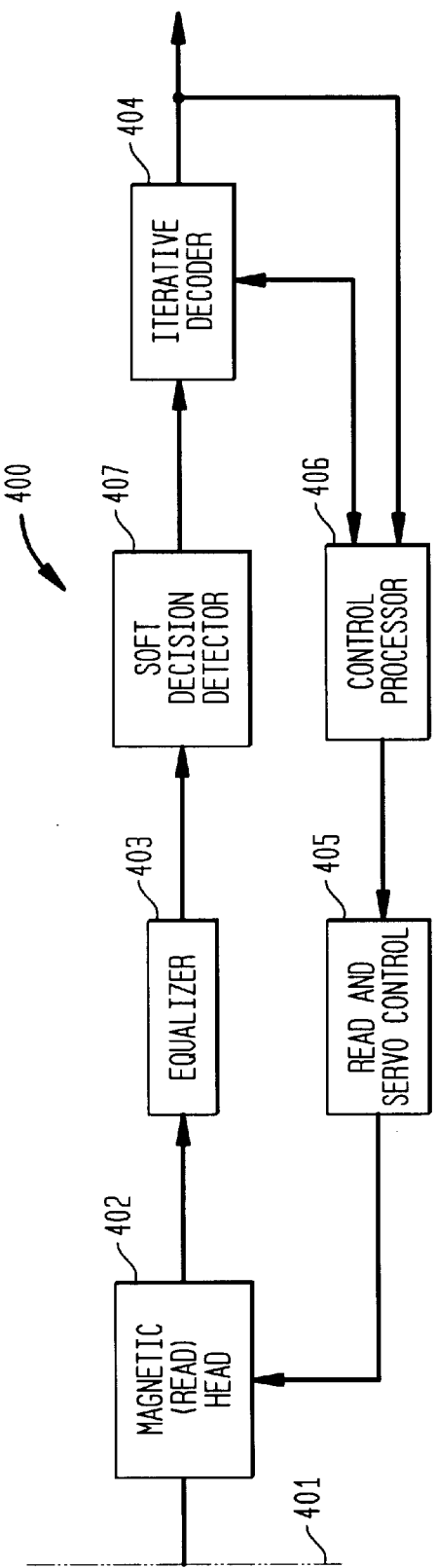
FIG. 4 shows a read side of a recording system employing an exemplary embodiment of the iterative decoding in accordance with the present invention.

FIG. 4 shows the read side of a recording system 400 employing iterative decoding of concatenated codes in accordance with one embodiment of the present invention.

Recording system 400, as described herein, is implemented as a magnetic recording system. Magnetic read head 402 receives an analog signal from recording medium 401. Recording medium 401 may be a magnetic recording disk or tape, and is desirably configured such that data and/or encoded data may be stored and read from the medium in accordance with a predefined format. For the exemplary recording system 400, data and/or encoded data are stored on the recording medium 401 in sectors of tracks where, for example, one sector comprises 512 bytes (4096 bits). The analog signal is sampled and provided to an equalizer 403 that equalizes the received signal according to a specified partial (frequency) response characteristic. Equalization may be employed to enhance performance of detection circuits and for the decoding process.

Figure 1:
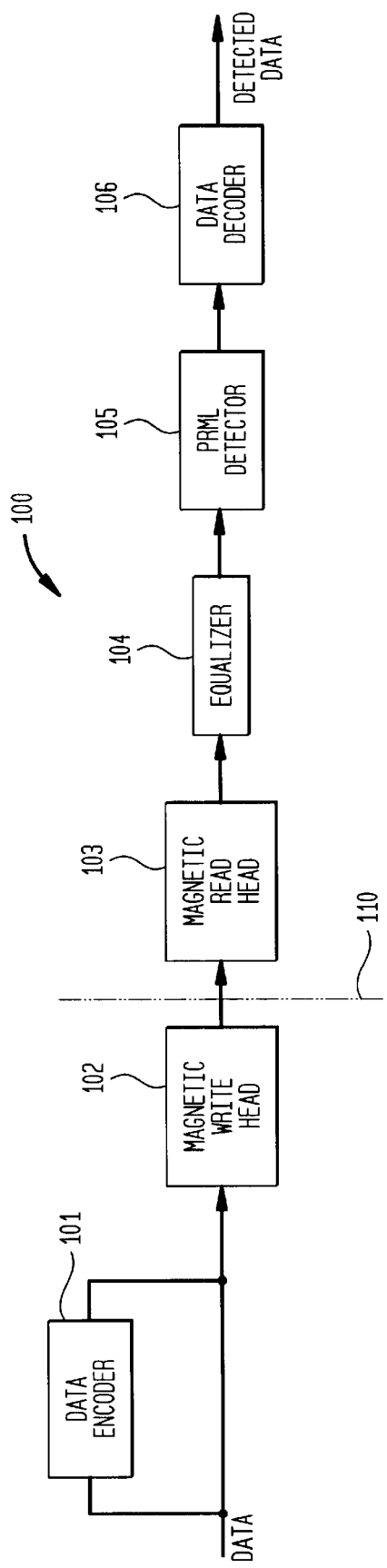
FIG. 1 shows a block diagram of processing of a magnetic recording system of the prior art.
Figure 2:
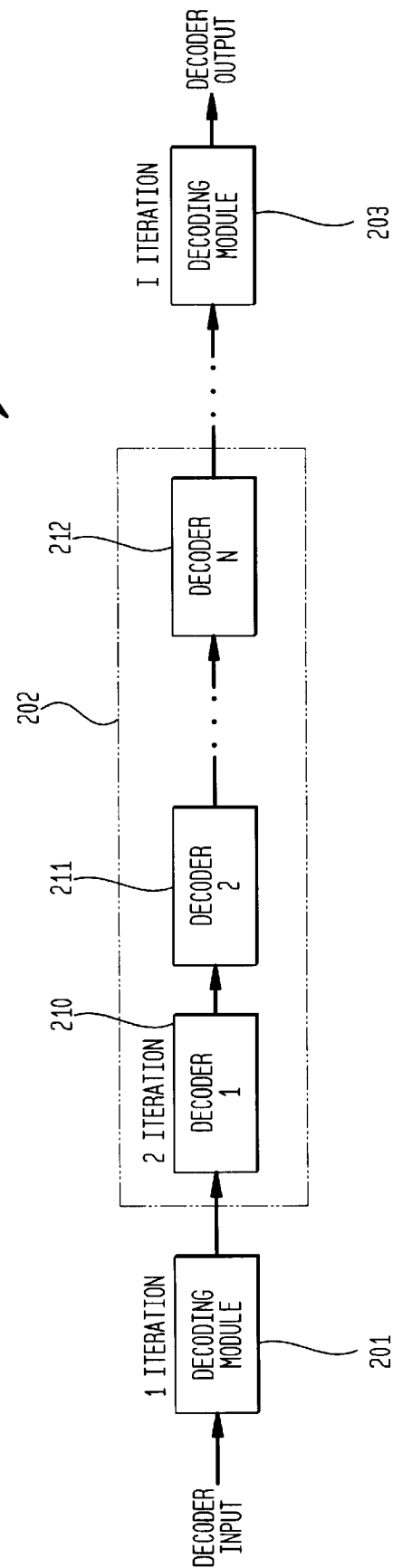
FIG. 2 shows a block diagram of an exemplary iterative decoder of the prior art employing serial iterative decoding.
Figure 3:
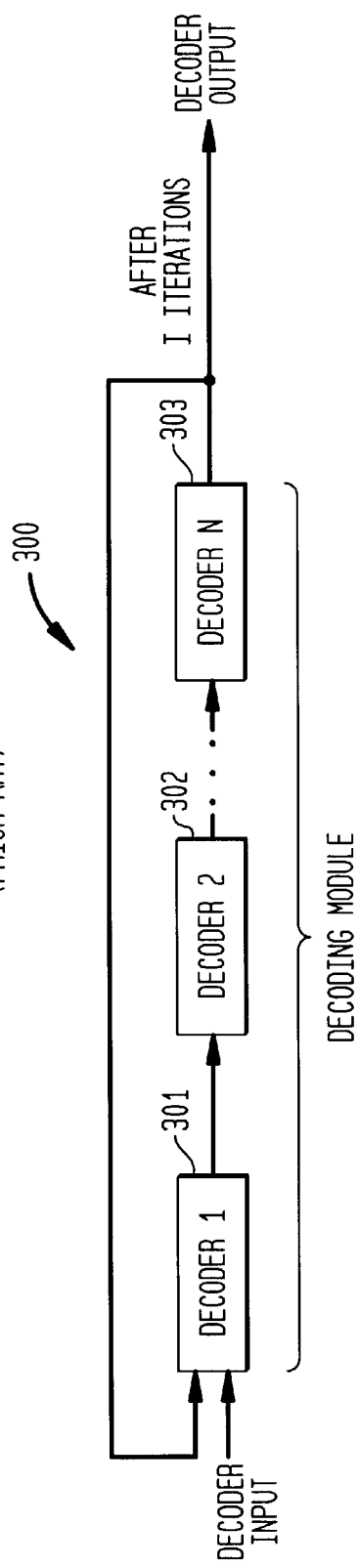
FIG. 3 shows an alternative implementation of an iterative decoder of the prior art employing a parallel iterative decoding.

Sampled signals from equalizer 403 correspond to output samples of the recording channel (hereinafter "channel output samples"). The term "channel" refers to the overall response of the recording medium, read head, and equalization associated with the storage and reading of data on the recording medium 401. Channel output samples are provided to a soft decision detector 407 for converting the channel output samples to detected output soft data samples (termed "soft output samples"). Soft decision detector 407 may be a PRML detector. Soft output samples are then provided to iterative decoder 404 which decodes the data encoded in accordance with either a serial or parallel concatenated code. The concatenated code has N component codes. The iterative decoder 404 preferably employs a parallel iterative decoding method with I iterations and N component code decodings. The iterative decoder 404 may have the form as described with respect to FIG. 3, and may generally be a circular, or cyclical, processor in which data blocks (blocks of soft output samples) are sequentially loaded in, cyclically processed, and sequentially provided out.

Recording system 400 further comprises a control processor 406 and a read and servo control circuit 405. Control processor 406 may perform or oversee operations of the recording system 400, including data input and scheduling of decoding operations of iterative decoder 404, as well as control of operations during read mode and servo mode by transmitting control signals to the read and servo control circuitry 405. Read and servo control circuitry 405 controls the position of magnetic read head 402 over the recording medium 401 during read mode, and, in conjunction with commands from control processor 406, controls the search process and movement of the magnetic read head 402 during servo mode.

For the magnetic recording system 400, one portion of the recorded data on medium 401 may contain user data. Another portion of the recorded data may be control data employed by the magnetic recording system 400 to seek and identify sectors and/or tracks, and to align and position the magnetic read head 402. After encoded data is processed that is read from one sector, the servo mode begins and the position of the magnetic read head 402 is changed. During servo mode, operations associated with read mode are suspended until the operations of servo mode are completed.

FIG. 5 is a flow chart of reading and iterative decoding of data in accordance with an exemplary embodiment of the present invention. First, at step 501, the soft output samples representing encoded data from a sector are loaded into the circular processor (e.g., parallel iterative decoder) during read mode. Then, at step 502, the soft output samples are cycled and iteratively processed in the circular processor during servo mode. Finally, at step 503, the decoded sector data is provided after the last iteration, while new sector data, if present, is loaded into the circular processor during read mode.

In exemplary implementations of the present invention, iterative decoding provides for reduced latency and reduced memory when a parallel iterative decoder is employed for decoding of data read from the recording medium 401 during successive read mode operations. In accordance with the exemplary embodiment, decoding by the iterative decoder 404 is enabled during the operation of servo mode between receiving sector data during successive read mode operations. By enabling iterative decoding during servo mode, soft output samples representing encoded data of one sector may be processed continuously and in a pipelined fashion, and soft output samples of two sectors may be processed between read mode operations continuously and in a pipelined fashion. The soft output samples of the sector received during a read operation are partitioned into packets. Partitioning the sector is by dividing the sector data by the number N of component codes of the concatenated code. For example, this process partitions a sector of 4096 bits into N packets, each packet having a packet length of (4096/N) bits. Such partitioning of the sector allows the iterative decoder 404 to employ parallel iterative decoding without incurring delay in processing between each packet.

FIG. 6 is a flow chart showing the steps of an exemplary implementation of iterative decoding of the present invention, such as shown in FIG. 5. For the exemplary implementation of the method of iterative decoding shown in FIG. 6, the structure of parallel iterative decoding may be similar to that shown in the block diagram of FIG. 3.

First, at step 600 read mode begins.

At step 601, the soft output samples representing encoded data of a sector are partitioned into N packets of length ((sector length)/N) For the exemplary embodiment the packet length may be 4096 /N. Herein, the term "length" refers to the number of bits in a packet or sector. As would be apparent to one skilled in the art, some overhead and padding bits may need to be inserted to improve processing in specific implementations.

Next, at step 602, the first of the packets (Packet 1) formed from the data of the partitioned sector is applied to the first component code decoder (Decoder 1). At step 603 the packet(s) in each of the N component code decoders (Decoder 1 up to Decoder N if the component code decoder contains a packet) are processed. Processing may include, for example, soft decoding with a maximum, a posteriori (MAP) decoder and recording the results for the decoding iteration.

At step 604, the next packet (e.g., Packet 2) is applied to Decoder 1. The decoded Packet 1 is passed to Decoder 2 when Packet 2 is applied to Decoder 1. In general, when the next packet is applied to Decoder 1, the decoded output of each packet in the component code decoders except Decoder N (Decoder 1 up to Decoder N−1) is shifted into the next component code decoder.

At step 605, a test is made to determine if Packet 1 is in Decoder N. If the test indicates that Packet 1 is not in Decoder N, the method returns to step 603 and processes the packets. If the test indicates that Packet 1 is in Decoder N, the method proceeds to step 606 in which servo mode is enabled. At step 606, the soft output samples representing the encoded data read from the sector during read mode are entirely stored within, at some level of processing, the set of component code decoders. Since all data of the sector is in the iterative decoder, servo mode may begin.

At step 607, the packets are processed in each of Decoder 1 through Decoder N. At step 608, the packets are circularly shifted between the component code decoders (the decoded output from Decoder N is applied to Decoder 1 and the output from Decoder 1 through Decoder N−1 are shifted into the next corresponding component code decoder). The first time step 608 is executed begins the second iteration of the iterative decoder.

At step 610, a test is made to determine if the iteration I−1 has completed. If the test of step 610 indicates that the current iteration is not iteration I−1 or the iteration I−1 has not completed, then the method returns to step 607. If the test of step 610 indicates that the current iteration is iteration I−1, then the method advances to step 611. In step 611, the packets in each of the component code decoders are processed. At step 612, the processed (fully decoded) packet in Decoder N is provided as a portion of the decoded user data. An external controller, such the control processor 406 of FIG. 4, may be employed to coordinate the final decision, and decisions during each iteration, for the decoded data (i.e., steps 605, 610, and 613).

In step 613, a test is made to determine if the processed packet in decoder N corresponds to the last fully decoded packet (i.e., the filly decoded Packet N). If the test of step 613 determines that the processed packet output from Decoder N is the last packet, then the processing ends. When processing ends, decoding of the currently read sector user data is complete. As would be apparent to one skilled in the art, once step 611 is reached, packets of user data from the next read sector may begin to shift into the decoder for the next application of the parallel iterative decoding method of the exemplary implementation.

If the test of step 613 determines that the processed packet output from Decoder N is not the last packet, then the method moves to step 614. At step 614, the remaining packets are shifted (i.e., the packet of the each corresponding component code decoder is shifted to the next component code decoder). When step 614 is complete, the method returns to step 611 to process the packets in each component code decoder.

By partitioning data into packets, and processing the packets by a parallel iterative decoder during servo mode, a recording system using concatenated codes may continuously read and decode user data without latency in the data decoding portion of read mode processing, and without the increased complexity of circuits that implement serial iterative decoding.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of decoding data stored in a medium of a recording system, comprising the steps of:
   (a) reading a section of the data from the medium as a number of packets during a read mode of the recording system, wherein the data is encoded in accordance with a concatenated code having N component codes, N an integer greater than 1, and the number of packets is related to N;
   (b) loading the packets of the section into a circular processor during read mode, the circular processor decoding in accordance with the N component codes;
   (c) iteratively cycling and processing, by the circular processor, the packets during a servo mode of the recording system; and
   (d) providing the decoded section of the data from the circular processor and, if present, returning to step a) to load a next section of the data.

2. The invention as recited in claim 1, wherein the circular processor of steps (b)–(d) is a parallel iterative decoder.

3. The invention as recited in claim 2, wherein the parallel iterative decoder of steps (b)–(d) includes N component code decoder modules, each module decoding a corresponding one of the N concatenated codes.

4. The invention as recited in claim 1, wherein the steps (a) through (d) are applied to data read in either an optical or a magnetic recording system.

5. Apparatus for decoding data stored in a medium of a recording system, comprising:
   a detector providing a section of the data from the medium as a number of packets during a read mode of the recording system, wherein the data is encoded in accordance with a concatenated code having N component codes, N an integer greater than 1, and the number of packets is related to N;
   a circular processor for receiving the packets of the section of data during read mode, the circular processor decoding in accordance with the N component codes, wherein:
      the circular processor 1) iteratively cycles and processes the packets during a servo mode of the recording system; 2) provides the decoded section of the data from the circular processor; and 3), if present, receives a next section of the data during a next read mode.

6. The invention as recited in claim 5, wherein the circular processor is a parallel iterative decoder.

7. The invention as recited in claim 6, wherein the parallel iterative includes N component code decoder modules, each module decoding a corresponding one of the N concatenated codes.

8. The invention as recited in claim 5, wherein the recording system is either an optical or a magnetic recording system.

9. A computer-readable medium having stored thereon a plurality of instructions, the plurality of instructions including instructions which, when executed by a processor, cause the processor to implement a method for decoding data stored in a medium of a recording system, the method comprising the steps of:
   (a) reading a section of the data from the medium as a number of packets during a read mode of the recording system, wherein the data is encoded in accordance with a concatenated code having N component codes, N an integer greater than 1, and the number of packets is related to N;
   (b) loading the packets of the section into a circular processing module during read mode, the circular processing module decoding in accordance with the N component codes;
   (c) iteratively cycling and processing, by the circular processing module, the packets during a servo mode of the recording system; and
   (d) providing the decoded section of the data from the circular processing module and, if present, returning to step a) to load a next section of the data.

10. The invention as recited in claim 9, wherein the circular processing module of steps (b)–(d) applies a parallel iterative decoding method.

11. The invention as recited in claim 10, wherein the parallel iterative decoding method of steps (b)–(d) includes N component code decoder modules, each module decoding a corresponding one of the N concatenated codes.

12. The invention as recited in claim 9, wherein the steps (a) through (d) are applied to data read in either an optical recording system or a magnetic recording system.

13. An integrated circuit having an iterative decoder for decoding data stored in a medium of a recording system, comprising:
   a detector providing a section of the data read from the medium as a number of packets during a read mode of the recording system, wherein the data is encoded in accordance with a concatenated code having N component codes, N an integer greater than 1, and the number of packets is related to N;
   a circular processor for receiving the packets of the section during read mode, the circular processor decoding in accordance with the N component codes, wherein:
   the circular processor 1) iteratively cycles and processes the packets during a servo mode of the recording system; 2) provides the decoded section of the data from the circular processor; and 3), if present, receives a next section of the data during a next read mode.

14. The invention as recited in claim 13, wherein the circular processor is a parallel iterative decoder.

15. The invention as recited in claim 14, wherein the parallel iterative decoder includes N component code decoder modules, each module decoding a corresponding one of the N concatenated codes.

16. The invention as recited in claim 13, wherein the recording system is either an optical recording system or a magnetic recording system.

* * * * *